United States Patent [19]

Golden

[11] Patent Number: 4,668,330

[45] Date of Patent: May 26, 1987

[54] FURNACE CONTAMINATION

[75] Inventor: Paul F. Golden, Mount View, Calif.

[73] Assignee: Monsanto Company, St. Louis, Mo.

[21] Appl. No.: 804,709

[22] Filed: Dec. 5, 1985

[51] Int. Cl.$^4$ .............................................. B05D 1/00
[52] U.S. Cl. ...................................... 156/601; 29/574;
118/664; 148/33; 148/DIG. 7; 156/DIG. 66; 427/8
[58] Field of Search ....................... 148/33, 33.1–33.6,
148/DIG. 7; 29/574, 576 T, 590; 156/DIG. 66,
601, 605; 427/8, 93; 118/664; 110/341

[56] References Cited

U.S. PATENT DOCUMENTS

| | | | |
|---|---|---|---|
| 4,220,483 | 9/1980 | Cazcarra | 156/DIG. 66 X |
| 4,257,825 | 3/1981 | Schaumburg | 156/601 X |
| 4,342,616 | 8/1982 | Elliot et al. | 156/601 |
| 4,420,497 | 12/1983 | Tickle | 427/8 |
| 4,440,799 | 4/1984 | Faith, Jr. | 29/574 X |
| 4,473,795 | 9/1984 | Wood | 29/574 X |
| 4,538,105 | 8/1985 | Ausschnitt | 29/574 X |

OTHER PUBLICATIONS

Walter, "Alloying Ohmic Contacts Into GaAs Structures," IBM Technical Disclosure Bulletin, vol. 14, No. 6, 11-1971, p. 1940.
Calhoun, et al., "Product Simulators for Epitaxy Test Cycles," IBM Technical Disclosure Bulletin, vol. 12, No. 8, 01-1970, pp. 1214–1215.

*Primary Examiner*—Albert J. Makay
*Assistant Examiner*—Steven E. Warner
*Attorney, Agent, or Firm*—Paul L. Passley

[57] ABSTRACT

The invention described herein describes certain test wafers to be used in diagnosing heavy metal contamination in furnaces used in the manufacture of electronic devices and the method of referencing such wafers to a common wafer source for establishing an accurate baseline for a furnace to determine if it is functioning adequately or if an impurity or contaminant problem exists.

4 Claims, No Drawings

FURNACE CONTAMINATION

This invention relates to diagnosing heavy metal contamination from tubes in furnaces used to manufacture the electronic devices, such as integrated circuits. Particularly, this invention provides for the reference measurement of contamination imparted to device substrates from sources related to the furnace used in device manufacture. More specifically, this invention is directed to means and method for determining the oxygen induced stacking faults defects imparted to silicon substrates used in the manufacture of electronic devices from impurities and contamination in the furnace, fluids, and other process steps.

In the manufacture of integrated circuits and other electronic devices on silicon wafers, the presence of and introduction of defects, contaminants and impurities on and near the device formation surface of the wafer creates excessive current leakages which greatly affects the yield of usable devices obtained. The art has recognized that the deleterious defects, heavy metal contaminants and impurities can be to some extent relocated to non-harmful regions in the substrate material away from the device formation region. The methods and processes for diffusing and trapping the defects, heavy metal contaminants and impurities away from the active device region both prior to and during device formation are termed gettering in the electronics industry and art.

DESCRIPTION OF THE PRIOR ART

One of the primary objectives of a typical wafer fabrication line furnace operation is to maintain "process worthiness" of each furnace tube. This involves continuous monitoring activities of parameters directly related to product defect density as well as optimizing equipment, process and starting material to obtain the highest possible yield for a given fabrication environment. The yield degrading contaminants and impurities in a furnace process develop as defect nucleation sites in substrate materials that propagate and deteriorate the electrical performance of devices produced. The level of efficiency to detect and identify such yield degrading defects determines the time frame of the corrective action cycle as well as the level of exposure of wafer batches in the furnace and thus the furnace operation yield factor.

Presently, fabrication lines schedule periodic furnace tube qualifications to establish process integrity based on specified electrical test and visual data as derived from a test run or a product batch. This is often accomplished by running monitor wafers through an oxidation cycle and thereafter evaluating the electrical and visual characteristic of the finished wafer. Another practice is to fabricate MOS capacitors on a grown oxide using aluminum or polysilicon gate electrodes. The capacitance-voltage evaluation technique is then utilized to derive the parameters as the basis from engineering judgement to correct any detected problem.

SUMMARY OF THE INVENTION

Typical objects of this invention are to provide:
1. Means to effectively and efficiency determine the relative heavy metal contamination and impurity levels imparted to substrate materials during manufacture of electronic devices.
2. Means for periodically determining the process worthiness of furnace tubes, fluids, and process steps used to manufacture electronic devices.
3. A method for determining the oxygen induced stacking fault defects imparted to device substrates from heavy metal contamination and impurities during device fabrication.

Other objects, characteristics and advantages of this invention will become apparent to those skilled in the art from this disclosure and appended claims.

In accordance with this invention an oxygen induced stacking fault defect density baseline is established to determine the relative level of cleanliness of a given furnace operation. This invention provides the user a quick and accurate vehicle for determining the run-to-run behavior of a particular furnace operation with minimum time and establish a good degree or accuracy of the useful life of furnace tubes, fluid quality, and other process steps for a given process and thus optimizes plant shutdowns for maintenance.

An oxygen induced stacking fault defect density baseline is established using a wafer reference procedure. A selected number of slices are obtained from the test wafers prepared from a particular ingot or rod of silicon and a like number of slices are obtained from a reference ingot or rod of silicon. Each selected slice is marked for silicon ingot or rod traceability and then pyrogenically oxidized at 1100° C. for 2 hours. Thereafter each slice is stripped of the oxide surface and Wright etched. The average oxygen induced stacking fault defects (defects/cm2) in the wafers going to the customer and in the reference wafers are determined. A reference ratio for later use by customer to determine the oxygen induced stacking faults during this manufacturing process is determined by dividing the reference wafers (defects/cm2) by the test wafers (defects/cm2). The ratio is used as a multiplicative factor for the resulting defect densities in each of the customer's furnace runs.

DESCRIPTION OF PREFERRED EMBODIMENTS

In the following example, a diffusion furnace with ambient steam to oxidize the wafers at 1100° C. for 80 minutes. Subsequently the wafers are etched using a Wright etch solution and then evaluated under Normarski Differential Interference contrast microscope with 200× magnification.

EXAMPLE 1

Two slices from each of 5 different silicon ingots and two slices from a reference silicon ingot are selected. Each silicon ingot and the reference ingot is N type (100) and 4 inches in diameter.

The selected slices are first subjected to the following oxidation cycle:
1. Furnace is heated to 800° C.
2. The wafers are pushed into the furnace at 800° C. at 150 mm per minute in a 3/1 nitrogen/oxygen ambient.
3. The furnace is ramped to 1100° C. at 20 degrees per minute in a nitrogen/oxygen ambient.
4. The wafers are dry oxidized for 10 minutes in an oxygen ambient.
5. The wafers are pyrogenically steam oxidized for 80 minutes in an oxygen/nitrogen ambient.
6. The wafers are oxidized for 10 minutes in a nitrogen ambient.

7. The furnace is ramped to 800° C. at 10 degrees per minute in a nitrogen ambient;
8. The wafers are pulled from the furnace at 150 mm per minute in nitrogen ambient.
9. The wafers are cooled for 15 minutes.

After oxidation of the wafers as described above the wafers are etched as follows:
1. The wafers are stripped of the oxide with a 10% HF solution and rinsed
2. The wafers are Wright etched for 4 minutes with vigorous agitation. The Write solution comprises: 2HF—2 acetic acid—1HNO$_3$—2 copper nitrate (33.3 grams/liter water)—1 chromic acid (500 grams of chromium trioxide per liter water)
3. The wafers are rinsed and dried.

After etching as described above, the wafers are evaluated as follows:
1. The wafers are inspected under high intensity light and any scratches or swirl noted.
2. Each wafer is placed on a microscope with the major flat 45 degrees to the right of the observer.
3. All oxygen induced stacking faults in each wafer in the field of view over the entire scan area using a scan pattern of two scans along the diameter of the wafer perpendicular to each other at 200× magnification are counted and noted.
4. The oxygen induced stacking faults per square centimeter is calculated by dividing the total faults by the scan area.

A reference ratio is calculated for each set of wafers from each ingot or rod of silicon to the reference rod as described above. The results are given below in Table 1. The reference numbers are indicative of the oxygen induced stacking fault defects obtained due to variations in the silicon ingots or rods and are used by the customer to determine if oxygen induced stacking faults are also being introduced from heavy metal contamination and/or impurities in his furnace, fluids and process steps.

TABLE 1

| Silicon Ingot | Stacking Faults | Reference ratio |
|---|---|---|
| Reference | 108 | 1.0 |
| A | 275 | .4 |
| B | 190 | .6 |
| C | 195 | .6 |
| D | 245 | .4 |
| E | 294 | .4 |

From the above table it is apparent that because of the variations in the oxygen induced stacking faults from ingot to ingot or rod of silicon that the reference ratio with provide the customer with a means of determining if he is getting any oxygen induced stacking faults from heavy metal contaminants in his furnace. For example, if from wafers A the user observes an oxygen induced stacking fault defect count of 300 he would multiply that count by 0.4, the reference ratio, and obtain a number of 120. This gives him a baseline for the furnace to determine future changes in heavy metal contamination or impurities. If he observes an oxygen induced stacking fault defect count of 600 the next time he runs a kit he would multiply that count by 0.4, the reference ratio, but would obtain a number of 320 which gives the indication that heavy metal contamination or impurities have increased in the furnace. For general comparison a 50% change in level of oxygen induced stacking faults will indicate a change in the base level of heavy metal contamination.

It will be readily apparent to those skilled in the art that the test wafers of this invention can be utilized for periodic furnace qualification runs or as a problem solving tool in a furnace operation. This approach can be used to qualify fluids and other wafer fab process steps by introducing the test wafers to the fluids or process steps before running them in a previously tested furnace. In qualification runs using the reference ratio supplied with the test kit of silicon wafers the user can readily correlate the performance of such wafers with the established normal performance of production wafers in the particular furnace. It will further be noted that as more and more test wafers are used in furnaces and more additional oxygen induced stacking fault counts are obtained that a trend chart will eventually be established as a very accurate baseline.

Also, one will readily see that since individual defect density baselines have been established for each furnace tube, any corrective action cycle between runs is minimized as compared to the classic capacitance-voltage techniques used to qualify furnaces for use in manufacturing electronic devices. Also, it will be apparent that the laborious preparation steps presently used are not required to derive the defect density data as compared to those techniques relying on electrical parametric data which requires much engineering analysis.

It will be noted that the above example used N type (100) wafers. However, it is to be understood that the invention can be equally operative using P type wafers and N type wafers of any orientation. In another embodiment, wafers processed to provide gettering ability can be used in the practice of this invention. Various ways to impart gettering to silicon wafers for substrates in the manufacture of electronic devices comprise ion implantation, backside damage and as more recently used a polysilicon layer on the backside of the wafer. The full description of the use of polysilicon layers on the backside of silicon wafers to enhance the gettering characteristics is contained in copending application Ser. Nos. 719,780 filed Apr. 4, 1985 now U.S. Pat. No. 4,608,095 and 736,203 filed June 28, 1985 now U.S. Pat. No. 4,608,096.

Of the possible wafers to be used as test wafers in this invention, each wafer type has a different sensitivity for a furnace contamination level with the N type (100) wafers being the most sensitive to oxygen induced stacking faults.

It is understood that the invention described above may have many changes and modifications in form and detail of the invention and specific utilization thereof may be made without departing from the spirit and scope of the invention and appended claims.

What is claimed is:
1. The method of detecting heavy metal impurities and contamination in furnaces used in the manufacture of electronic devices comprising determining the relative susceptibility of semiconductor test wafers to oxygen induced stacking fault defects to the oxygen induced stacking fault defects of standard or reference wafers to provide a reference ratio, processing said test wafers in the furnace to be used to manufacture electronic devices and determine the amount of oxygen induced stacking faults under the furnace operating conditions and multiplying such determined defects by the reference ratio supplied with the test wafers to de- termine if a base level of heavy metal contamination is present.

2. The method of claim 1 wherein when the oxygen induced stacking fault defects, calculated from the test wafers processed in the furnace using the reference ratio, deviate 50% from the base level for the furnace the heavy metal impurity or contamination condition has changed.

3. The method of claim 1 wherein the test wafers are silicon wafers.

4. The method of claim of claim 1 wherein the test wafers are silicon N type (100) wafers.

* * * * *